United States Patent Office 3,558,322
Patented Jan. 26, 1971

3,558,322

PHOTOACTIVATABLE COMPOSITIONS AND LAYERS CONTAINING ARYLTHIOKETONES

Roxy Ni Fan, East Brunswick, N.J., assignor to E. I. du Pont de Nemours and Company, Wilmington, Del., a corporation of Delaware No Drawing. Filed Oct. 30, 1968, Ser. No. 772,054
Int. Cl. G03c *1/68*
U.S. Cl. 96—115 10 Claims

ABSTRACT OF THE DISCLOSURE

Photoactivatable systems, such as those containing photopolymerizable compositions, exhibiting improved photospeed and/or color-forming properties contain thioketones of the following types: (1) aryl and substituted aryl thioketones

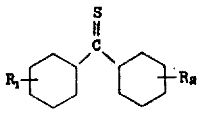

where $R_1$, $R_2$=H, alkyl, alkoxy, alkylamino, halogen, etc., (2) condensed or heterocondensed aromatic thioketones

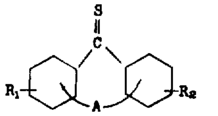

where $R_1$, $R_2$ are the same as above; A=a covalent bond or an atom or group of atoms (C, O, S) necessary to make a condensed ring, and (3) heteroaromatic thioketones

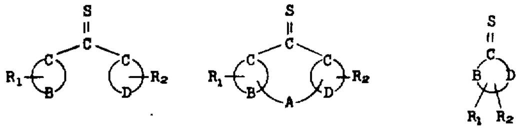

where $R_1$, $R_2$, A are the same as above; B, D=atom or group of atoms (C, O, S, N) necessary to make an aromatic heterocyclic or condensed aromatic heterocyclic rings.

BACKGROUND OF THE INVENTION

Field of the invention

This invention relates to photoactivatable color-forming compositions. It also relates to photopolymerizable elements which contain useful initiating and color-forming agents. More particularly it relates to such agents which are capable of increasing the photospeed, intensifying the visible image, improving the spectral response, and enhancing the color-forming properties of such elements.

Description of prior art

Photopolymerizable compositions as image-forming systems are well known in the art. Such elements are useful for preparing relief and lithographic printing plates.

In the photopolymerization of ethylenically unsaturated compounds it is well known to increase the speed of such polymerization by the addition of initiators. Of particular usefulness as initiators in the preparation of lithographic printing plates are the imidazolyl compounds in Chambers, U.S. Ser. No. 688,703, filed Dec. 7, 1967, now U.S. Pat. No. 3,479,185, and the photoinitiating system using a triarylimidazolyl dimer consisting of two lophine radicals bound together by a covalent bond together with a p-aminophenyl ketone described in assignee's Chang et al., U.S. Ser. No. 731,733, filed May 24, 1968.

The thioketones of the present invention when incorporated into photopolymerizable compositions produce an improved film element exhibiting increased speed and improved spectral response. Further, when combined with a lophine dimer or an o-quinone, these thioketones form a color-forming photoactivatable system.

SUMMARY OF THE INVENTION

It is an object of this invention to produce an improved photopolymerizable layer exhibting increased photospeed and contrast. It is a further object to produce new chemical formulations useful as color-forming adjuvants.

The objects of this invention are achieved by incorporating into photoactivatable systems, such as those containing photopolymerizable compositions, thioketones of the following types: (1) aryl and substituted aryl thioketones

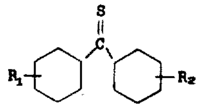

where $R_1$, $R_2$=H, alkyl, alkoxy, alkylamino, Cl or Br, (2) condensed or heterocondensed aromatic thioketones

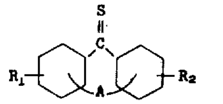

where $R_1$, $R_2$ are the same as above; A=a covalent bond or an atom or group of atoms (C, O, S) necessary to make a condensed ring, and (3) heteroaromatic thioketones

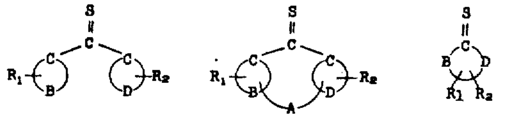

where $R_1$, $R_2$, A are the same as above; B, D=atom or group of atoms (C, O, S, N) necessary to make an aromatic heterocyclic or condensed aromatic heterocyclic rings, e.g., an oxazole, thiazole, imidazole, pyridine or quinoline radical. Suitable alkyl and alkoxy radicals have 1 to 4 carbons and include methyl, ethyl, n-propyl, isopropyl, n-butyl, tert. butyl, and the corresponding alkoxy radicals.

DESCRIPTION OF THE PREFERRED EMBODIMENTS

Although thioketones are weak photoinitiators and are suitable for incorporation into a photopolymerizable layer to increase photospeed, in a preferred formulation the thioketone is added to a lophine dimer/leuco dye/p-aminophenyl ketone initiated system for increased photospeed and intensification of the visible image. Thus, in a preferred embodiment of this invention, 4,4'-bis(dimethylamino)thiobenzophenone is added to a photopolymerizable composition containing 2(o-chlorophenyl)-4,5-bis(m-methxyphenyl)imidazolyl dimer/tris-(p-diethylamino-o-tolyl)methane/4,4' - bis - dimethylaminobenzophenone. Other useful photoinitiating systems which contain thioketones and which may be incorporated into a photopolymerizable composition to produce an improved image-forming layer or element include the following:

(1) A thioketone and a 2,4,5-triarylimidazolyl dimer consisting of two lophine radicals bound together by a single covalent bond
(2) A thioketone, said lophine dimer and a leuco dye
(3) A thioketone and an o-quinone
(4) A thioketone, an o-quinone and a p-aminophenyl ketone
(5) A thioketone, said lophine dimer and a p-aminophenyl ketone.

When used alone, thioketones are weak photoinitiating agents. When combined with other photoinitiators, they serve as cophotoinitiators, enhancing the catalytic effect. When thioketones are used in combination with a lophine dimer or an o-quinone, this cophotoinitiating effect is observed; however, in this instance this increased rate of photopolymerization is often accompanied by a color-forming effect which results in the formation of a visible image of increased intensity.

Lophine dimers which may be used in combination with the thioketones of this invention include those containing at least one 2,4,5-triarylimidazolyl dimer consisting of two lophine radicals bound together by a single covalent bond, e.g., 2(o-chlorophenyl) - 4,5 - diphenylimidazolyl dimer, and others described in Chang et al., U.S. Ser. No. 731,733, filed May 24, 1968 and British patent specifications 997,396 published July 7, 1965 and 1,047,569, published Nov. 9, 1966.

o-Quinones which may be substituted for the lophine dimers to produce the desired photographic effect include phenanthraquinone, 1,2 - naphthoquinone, chrysenequinone, and 2,7-di tert-butylphenanthraquinone and the other polynuclear quinones disclosed in Notley U.S. Pat. 2,951,758, Sept. 6, 1960.

The p-aminophenyl ketones are sensitive to light and act as cophotoinitiators for photopolymerization reactions when combined with thioketones in the photopolymerizable element of this invention. Suitable p-aminophenyl ketones are disclosed in Chang et al., U.S. Ser. No. 731,733, filed May 24, 1968 and Fishman, U.S. Ser. No. 654,677, filed July 20, 1967, of assignee.

The concentration of thioketone useful in practicing this invention is limited by its solubility in the photopolymer coating composition. Increasing the concentration of thioketone increases the color intensity of the visible image; however, this occurs at the expense of the photospeed which decreases with increasing thioketone concentration.

It is usually advantageous to include other components in the imaging formulation, such as solvents, sensitizers, plasticizers and/or binders to provide intimate contact among the ingredients and to facilitate their application to substrates in coating operations. Useful sensitizers include the xanthenes and coumarins disclosed in assignee's Chambers application Ser. No. 688,703, filed Dec. 7, 1967, now U.S. Pat. No. 3,479,185.

A wide range of nonpolymerizable plasticizers are effective in achieving improved exposure and development temperature latitude. See Chang et al., U.S. Ser. No. 731,733, filed May 24, 1968, for useful specific such plasticizers.

In addition, the photopolymerizable compositions and layers may contain a colorant and/or a color-producing agent. Useful colorants include the dyes and pigments described in assignee's Burg et al., U.S. Pat. 3,060,023. Suitable color-producing agents are the leuco dyes. The amine-substituted leuco dyes can function both in the role of a color-forming agent and a free radical generating agent. Especially useful leuco dyes are those having at least one dialkylamino group. Also, any amine-substituted leuco triphenylmethane dye or various salts of the dye, e.g., the hydrochloride of the leuco blue dye can be used. Suitable dyes are disclosed in Chang et al., U.S. Ser. No. 731,733, filed May 24, 1968.

The compositions containing the thioketones of this invention may contain a thermoplastic macromolecular organic polymer binder, e.g., cellulose acetate, cellulose acetate butyrate, polymethyl acrylate, polymethyl methacrylate, methyl methacrylate copolymerized with methacrylic acid, etc. Other useful binders are disclosed in assignee's Colgrove, U.S. Pat. 3,353,955. To the binder in a suitable solvent is added a monomer which is ethylenically unsaturated and suitable for free radical-initiated, chain-propagating addition polymerization, e.g., pentaerythritol triacrylate, polyethylene glycol diacrylates, triethylene glycol diacrylate, polyethylene glycol dimethacrylates, polymethylene diacrylate and dimethacrylate, trimethylolpropane triacrylate and trimethacrylate. These monomers have at least two terminal ethylenic groups.

The addition polymerizable polymers disclosed in assignee's Schoenthaler, U.S. Ser. No. 451,300, filed Apr. 27, 1965, now U.S. Pat. No. 3,418,295, and Celeste, U.S. Ser. No. 533,817, filed Mar. 14, 1966, now U.S. Pat. No. 3,448,089, can be used in lieu of or in combination with the monomer-binder systems. If desired, a cover sheet, such as described in assignee's Heiart, U.S. Pat. 3,060,026 can be laminated to the photopolymer layer, or the layer can be overcoated with a wax layer such as described in assignee's Burg, U.S. Pat. 3,203,805 or a layer of polyvinyl alcohol or gelatin can be coated as described in assignee's Alles, U.S. Ser. No. 560,899, filed June 27, 1966, now abandoned.

Development of the exposed film element may be accomplished by solvent washout, thermal transfer, pressure transfer, pigment application to unpolymerized areas, differential adhesion of exposed vs. unexposed areas, etc. Development may produce either a relief or an image on a separate receptor.

Typical inert substrates suitable for coating the photopolymerizable compositions of this invention include materials commonly used in the graphic arts, such as paper ranging from tissue paper to heavy cardboard; films of plastics and polymeric materials such as regenerated cellulose, cellulose acetate, cellulose nitrate, polyesters of glycol and terephthalic acid, vinyl polymers and copolymers, polyethylene, polyvinylacetate, polymethyl methacrylate, polyvinylchloride; textile fabrics, glass; wood and metals.

The following specific examples are given for a clearer understanding of the invention. These examples are intended to be merely illustrative of the invention and not in limitation thereof.

EXAMPLE I

The following solution was prepared:

| Solution A: | G. |
|---|---|
| Poly(methyl methacrylate/methacrylic acid) (90/10) | 300 |
| Trimethylolpropane triacrylate | 114 |
| Mixture of hexanoic and octanoic acid esters of triethylene glycol | 36 |
| Methyl ethyl ketone to | 2,700 |

To 90 g. of the above solution, there was added 0.076 g. of the thioketone 4,4'-bis(dimethylamino)thiobenzophenone. The solution was stirred to dissolve and brought to 120 g. with methyl ethyl ketone. The resulting solution was pour-coated as described in Alles, U.S. Ser. No. 690,732, filed Dec. 15, 1967, now U.S. Pat. No. 3,458,311, on a brush grained aluminum support of the type used in lithography. The coating was dried in a 116° C. oven for one minute and then over-coated with the following composition.

| Solution B: | | |
|---|---|---|
| Polyvinyl pyrrolidone (M.W. 30,000) | g. | 90 |
| Polyvinyl alcohol (medium viscosity 88% saponified) | g. | 60 |
| 2-ethoxyethanol | ml. | 45 |

| | |
|---|---|
| Ethanol ml | 45 |
| Surfactant (isooctyl phenyl polyethoxyethanol 10% by wt. aqueous) ml | 15 |

After drying at 116° C. for 2 minutes, the aluminum plates were exposed through a negative (21 $\sqrt{2}$ step Graphic Arts Technical Foundation exposure wedge) in a vacuum frame with a carbon arc (B–1C Constantarc—140 ampere. No. 1112–Ld 612 Macbeth Arc Lamp Co., Philadelphia, Pa.) for 172 sec. at a distance 56 in. from the arc lamp. The plates were developed by washing out the unexposed parts of the coatings using a solution of the following composition.

Solution C:

| | |
|---|---|
| Trisodium phosphate ($Na_3PO_4 \cdot 12H_2O$) g | 25.0 |
| Sodium phosphate (monobasic $NaH_2PO_4 \cdot H_2O$) g | 4.4 |
| 2-butoxyethanol ml | 70.0 |
| Isooctyl phenyl polyethoxyethanol (10% by wt. aqueous) ml | 2.0 |
| Water (distilled) to 1 liter. | |
| pH adjusted to 11.0. | |

An exposure of 172 sec. gave an image of 1$\sqrt{2}$ steps.

EXAMPLE II

The filament of Example I was prepared with the use of 0.176 g. of 4,4'-bis(dimethylamino)thiobenzophenone and addition of 0.375 g. of 2(o-chlorophenyl)-4,5-dimethoxy-phenylimidazolyl dimer to coating Solution A.

Exposure and development of the film element as described in Example I gave (on exposure for 52 sec.) a strong blue visible image of 1$\sqrt{2}$ steps.

EXAMPLE III

The film element of Example I containing 0.176 g. of 4,4'-bis(dimethylamino)thiobenzophenone and also 0.37 g. of 2(o-chlorophenyl)-4,5-diphenylimidazole in coating Solution A was prepared, exposed and developed as described in Example I.

An exposure of 172 sec. gave a strong blue visible image of 7$\sqrt{2}$ steps.

EXAMPLE IV

The film element of Example I containing 0.176 g. of 4,4'-bis(dimethylamino)thiobenzophenone and 0.13 g. of phenanthraquinone in Solution A was prepared, exposed and developed using the procedures of Example I.

An exposure of 172 sec. produced a blue visible image of 0.5$\sqrt{2}$ steps.

EXAMPLE V

The film element of Example I containing 0.176 g. of 4,4'-bis(dimethylamino)thiobenzophenone and also 0.095 g. of 1,2-naphthoquinone in Solution A was prepared, exposed, and developed as described in Example I.

An exposure of 172 sec. produced a blue visible image of 1$\sqrt{2}$ steps.

EXAMPLE VI

The film element of Example I, with coating Solution A containing 0.176 g. of 4,4'-bis(dimethylamino)thiobenzophenone and also 0.192 g. of 2,7-di-tert.-butylphenanthraquinone, was prepared, exposed, and developed as described in Example I.

An exposure of 172 sec. gave a blue visible image of 3$\sqrt{2}$ steps.

EXAMPLE VII

The film element of Example I, with coating Solution A containing 0.176 g. of 4,4'-bis(dimethylamino)thiobenzophenone and also 0.157 g. of chrysenequinone, was prepared, exposed and developed as described in Example I.

Exposure for 172 sec. gave a blue visible image of 0.5$\sqrt{2}$ steps.

EXAMPLE VIII

The film element of Example I, with coating Solution A containing 0.176 g. of 4,4'-bis(dimethylamino)thiobenzophenone; 0.37 g. of 2(o-chlorophenyl)4,5-dimethoxyphenylimidazolyl dimer, and 0.112 g. of tris-(p-diethylamino-o-tolyl)methane, as further ingredients, was prepared, exposed, and developed, as described in Example I.

An exposure of 172 sec. produced a bright blue visible image of 6$\sqrt{2}$ steps.

EXAMPLE IX

The film elements of Example I, with coating Solution A containing 0.176 g. of 4,4'-bis(dimethylamino)thiobenzophenone, 0.37 g. of 2(o-chlorophenyl)-4,5-dimethoxy-phenylimidazolyl dimer, 0.112 g. of tris-(p-diethylamino-o-tolyl)methane, and 0.17 g. of 4,4'-bis(dimethylamino)benzophenone, as further ingredients, was prepared, exposed, and developed, as described in Example I.

An exposure of 172 sec. gave a bright blue visible image of 7$\sqrt{2}$ steps.

EXAMPLE X

The following solution was prepared:

| | Grams |
|---|---|
| Poly(methyl methacrylate/methacrylic acid) (90/10) | 300.0 |
| Tris-(p-diethylamino-o-tolyl)methane | 13.5 |
| Mixture of hexanoic and octanoic acid esters of triethylene glycol | 36.0 |
| 2(o-chlorophenyl)-4,5-bis(m-methoxyphenyl) imidazolyl dimer | 16.8 |
| 4,4'-bis(dimethylamino)benzophenone | 9.0 |
| C.I. solvent red #109 | 6.0 |
| 4,4'-bis(dimethylamino)thiobenzophenone | 0.3 |
| Trimethylolpropane triacrylate | 114.0 |
| 2-ethoxyethanol | to 1500.0 |

The solution was coated on an aluminum support, dried in a 116° C. oven for 1.5 min. and then overcoated with Solution B as described in Example I.

The aluminum plate was dried for 4 min. at 116° C. and exposed through a negative in a vacuum frame, as described in Example I, for 26 sec. at a distance 56 in. from the arc. A sharp blue visible image of 6$\sqrt{2}$ steps was produced on a red polymer background. The plates were developed using the procedures and solution of Example I. The exposed areas of the plate readily accepted greasy or lipophilic ink. The unexposed areas could be readily wetted with water. An analysis of the halftone dots showed the presence of good quality 2% dots in the highlight areas and 98% dots in the shadow areas. The plate was treated with an aqueous gum solution in the conventional manner and placed on a wet offset printing press using a printing ink and a fountain solution. A successful printing run of 250,000 impressions was made with no visible signs of wear at the end of the run, and the plate required no special attention during the run.

EXAMPLE XI

The following solutions were prepared:

| | Solution D, g. | Solution E, g. |
|---|---|---|
| Poly(methyl methacrylate/methacrylic acid) (90/10) | 5.0 | 5.0 |
| Mixture of hexanoic and octanoic acid esters of triethylene glycol | 2.2 | 2.2 |
| 4,4-bis(dimethylamino)thiobenzophenone | 0.085 | 0.085 |
| 2(o-chlorophenyl)-4,5-bis (m-methoxyphenyl) imidazolyl dimer | 0.185 | ---------- |
| 2,7-di tert-butyl phenanthraquinone | | 0.096 |
| Methyl ethyl ketone | 40.0 | 40.0 |

Each of the above solutions was coated on an aluminum support, dried and exposed using the procedures of Example I.

The coating of Solution D produced a visible image upon 26 sec. exposure, while the coating of Solution E gave a visible image upon 100 sec. exposure.

EXAMPLE XII

The following solutions were prepared:

| | Solution F, g. | Solution G, g. |
|---|---|---|
| Cellulose acetate butyrate (13% acetyl, 37% butyryl, 2% hydroxyl) | 6.0 | 6.0 |
| Triethylene glycol diacetate | 4.0 | 4.0 |
| p-Toluene sulfonic acid | 0.21 | 0.21 |
| 4,4'-bis(dimethylamino)thiobenzophenone | 0.34 | 0.34 |
| 2(o-chlorophenyl)-4,5-bis (m-methoxyphenyl) imidazolyl dimer | 0.62 | ---- |
| 2,7-di-tert-butylphenanthraquinone | ---- | 0.39 |
| Acetone | 46.0 | 46.0 |

The solutions were coated on films of polyethylene terephthalate, as described in Example XIII below.

The coating of Solution F produced a visible image upon 30 sec. exposure using a nuArc "Flip-Top" Platemaker, Model FT26M–2 light source, while the coating of Solution G required a 100 sec. exposure for a good visible image.

EXAMPLE XIII

The following solution was prepared:

| | G. |
|---|---|
| Cellulose acetate butyrate (as in Example XII) | 20.0 |
| 2-(o-chlorophenyl)-4,5 - bis(m - methoxyphenyl) imidazolyl dimer | 0.75 |
| 4,4'-bis(dimethylamino)thiobenzophenone | 0.48 |
| Tris-(p-diethylamino-o-tolyl)methane | 0.7 |
| Trimethylolpropane triacrylate | 28.0 |

Methyl ethyl ketone total weight to 380 g.

The above solution was coated onto a sheet of 0.001" film base of polyethylene terephthalate with a 2-ml. doctor knife. After drying at 20° C. for 2 min., the coating was laminated with a cover sheet of polyethylene terephthalate. The resulting coating produced a blue visible image upon 172 sec. exposure using the light source and procedures of Example I.

After stripping the polyethylene terephthalate cover sheet from the coating composition, the coating was dusted with C.I. Pigment Red 104. The pigment adhered to the unpolymerized areas only to give a bright colored image.

EXAMPLE XIV

The following solutions were prepared:

| | Solution H, g. | Solution I, g. | Solution J, g. |
|---|---|---|---|
| N-Methyl benzothiazole-2-thione | 0.11 | 0.11 | 0.11 |
| 2(o-chlorophenyl)-4,5-bis (m-methoxyphenyl) imidazolyl dimer | | 0.37 | ---- |
| 2,7-di-tert-butyl phenanthraquinone | | | 0.19 |
| Poly(methyl methacrylate/methacrylic acid) (90/10) | 10.00 | 10.00 | 10.00 |
| Trimethylolpropane triacrylate | 3.80 | 3.80 | 3.80 |
| Mixture of hexanoic and octanoic acid esters of triethylene glycol | 1.20 | 1.20 | 1.20 |
| Methyl ethyl ketone | 120.00 | 120.00 | 120.00 |

The above solutions were coated on aluminum supports, exposed, and developed as described in Example I. Exposure of Solution H for 344 sec. produced a latent image of 1$\sqrt{2}$ steps. A 344 sec. exposure of Solution I gave an image of 13$\sqrt{2}$ steps, while the same exposure of Solution J produced an image of 7$\sqrt{2}$ steps.

EXAMPLE XV

The following solutions were prepared:

| | Solution K, g. | Solution L, g. |
|---|---|---|
| Xanthione | 0.124 | 0.124 |
| 2(o-chlorophenyl)-4-5- bis (m=methoxyphenyl) imidazolyl dimer | | 0.37 |
| Poly(methyl methacrylate/methacrylic acid) (90/10) | 10.00 | 10.00 |
| Trimethylolpropane triacrylate | 3.80 | 3.80 |
| Mixture of hexanoic and octanoic acid esters of triethylene glycol | 1.20 | 1.20 |
| Methyl ethyl ketone | 120.00 | 120.00 |

These solutions were coated onto two supports of aluminum, exposed, and developed by the procedure of Example I. Exposure of both film elements for 344 sec. produced a latent image of 1$\sqrt{2}$ steps.

EXAMPLE XVI

The following solutions were prepared:

| | Solution M, g. | Solution N, g. | Solution O, g. |
|---|---|---|---|
| Tioxanthione | 0.06 | 0.06 | 0.06 |
| 2(o-chlorophenyl)-4,5- bis (m=methoxyphenyl) imidazolyl dimer | | 0.37 | 0.37 |
| Tris-(p-diethylamino-o-tolyl)methane | | | 0.134 |
| Poly(methyl methacrylate/methacrylic acid) (90/10) | 10.00 | 10.00 | 10.00 |
| Trimethylolpropane triacrylate | 3.80 | 3.80 | 3.80 |
| Mixture of hexanoic and octanoic acid esters of triethylene glycol | 1.20 | 1.20 | 1.20 |
| Methyl ethyl ketone | 120.00 | 120.00 | 120.00 |

Each of the above solutions was coated on a separate aluminum support, exposed and developed as described in Example I. Exposure of Solution M for 344 sec. produced a latent image of 7$\sqrt{2}$ steps. Exposure of Solution N for 344 sec. gave an image of 9$\sqrt{2}$ steps. Exposure of Solution O for 344 sec. produced an image of 17$\sqrt{2}$ steps.

The thioketones of this invention may be incorporated into photopolymer lithographic printing plates and all other photopolymer compositions when it is desirable to increase the photospeed and/or impart color to the final product. The thioketones are useful in the production of relief printing plates as disclosed in Plambeck, U.S. Pat. 2,760,863.

Although the invention has been described in terms of its applicabiilty to photopolymerizable compositions, the thioketone/lophine dimer or thioketone/o-quinone combinations may be incorporated into any system where it is desirable to produce a light-actuated coloring effect.

As stated above, the amount of thioketone present in the photoactivatable layers can vary widely, e.g., from 0.02% by weight of the layer to the limit of solubility in the coating composition. A preferred range is 0.03 to 1.00% by weight.

The amount of the lophine dimer and o-quinone may also vary considerably, e.g., from about 0.05% to 5% by weight and more. A preferred range is 0.10 to 4.0% by weight of the coating composition.

As indicated above, no macromolecular organic polymer binder need be present. However, 100% binder (no monomer) may be present in the layer. In general, 3 to 97% of binder and 97 to 3% by weight, respectively, of monomer and binder may be present in the photoactivatable layer.

The novel image-forming compositions described above can be coated on or laminated to, if in sheet or layer form, various supports, including paper, metal foils or plates, and films. Any of the specific supports described in the patent application, patent specifications, and patents listed above, especially those set forth in Burg et al., U.S. Pat. 3,060,023, can be used.

The thioketones of this invention enhance the photographic speed and contrast of film elements coated with photopolymerizable compositions. Furthermore, when used in combination with a lophine dimer or an o-quinone the thioketones form a color-producing photoactivatable system. The photographic elements comprising the photopolymerizable compositions of this invention exhibit good exposure time, development latitude and have exceptionally good aging stability and long shelf life.

The embodiments of the invention in which an exclusive property or privilege is claimed are defined as follows:

1. A photoactivatable composition comprising:

(a) at least one thioketone of the formula

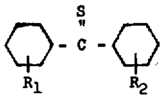

where each of $R_1$ and $R_2$ are H, alkyl, alkoxy, or alkylamino of 1–4 carbon atoms, Cl or Br,

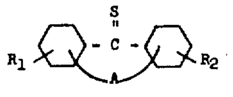

where $R_1$ and $R_2$ are as defined in the first formula and a constitutes a covalent bond or the atoms, C, O, S, necessary to make a condensed ring, and

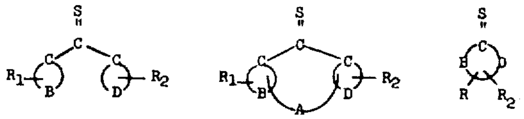

where $R_1$ and $R_2$ are as defined in the first formula, B and D are the atoms, C, O, S, N, necessary to make an aromatic heterocyclic radical or a condensed aromatic heterocyclic ring; and (b) an ethylenically unsaturated monomer, a 2,4,5-triarylimidazolyl dimer consisting of two lophine radicals bound together by a single covalent bond or an o-quinone photoinitiator.

2. A photopolymerizable composition comprising:

(a) at least one thioketone of the formula

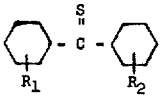

wherein each of $R_1$ and $R_2$ are H, alkyl, alkoxy, or alkylamino of 1–4 carbon atoms, Cl or Br,

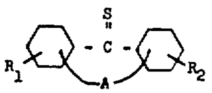

where $R_1$ and $R_2$ are as defined in the first formula and A constitutes a covalent bond or the atoms, C, O, S, necessary to make a condensed ring, and

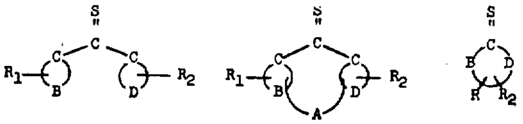

where $R_1$ and $R_2$ are as defined in the first formula, B and D are the atoms, C, O, S, N, necessary to make an aromatic heterocyclic radical or a condensed aromatic heterocyclic ring; and (b–1) a 2,4,5-triarylimidazolyl dimer consisting of two lophine radicals bound together by a single covalent bond; and (c) at least one non-gaseous ethylenically unsaturated compound capable of forming a high polymer by free-radical-initiated, chain propagating addition polymerization.

3. A composition according to claim 2, wherein said dimer is a 2,4,5-triphenylimidazolyl dimer.

4. A composition according to claim 2 containing:

(b–2) an o-quinone addition polymerization initiator.

5. A composition according to claim 2 containing:

(b–2) a polynuclear quinone having two intracyclic carbonyl groups attached to intracyclic carbon atoms in a conjugated six-membered ring, there being at least one aromatic carbocyclic ring fused to the ring containing said carbonyl groups.

6. A composition according to claim 2, wherein component (b) is said dimer, said composition containing:

(d–1) a leuco dye.

7. A composition according to claim 2, wherein component (b) is said dimer, said composition containing:

(d–2) a p-aminophenyl ketone.

8. A composition according to claim 2, wherein component (b) is an o-quinone photoinitiator, said composition containing:

(d–3) a p-aminophenyl ketone.

9. An image-forming element comprising a support bearing a layer of a composition as defined in claim 1.

10. An image-forming element comprising a support bearing a layer of a composition as defined in claim 2.

References Cited

UNITED STATES PATENTS

| | | | |
|---|---|---|---|
| 3,081,168 | 3/1963 | Leekley et al. | 96—35.1 |
| 3,458,311 | 7/1969 | Alles | 96—115X |
| 3,462,268 | 8/1969 | Danhauser et al. | 96—35.1 |
| 3,479,185 | 11/1969 | Chambers | 96—115X |

WILLIAM D. MARTIN, Primary Examiner

H. J. GWINNELL, Assistant Examiner

U.S. Cl. X.R.

96—35.1, 85, 86, 87; 204—159.23